US011680997B2

(12) United States Patent
Xue et al.

(10) Patent No.: US 11,680,997 B2
(45) Date of Patent: Jun. 20, 2023

(54) COOLING SYSTEM OF A MAGNETIC RESONANCE APPARATUS AND MAGNETIC RESONANCE APPARATUS

(71) Applicant: Siemens Healthcare GmbH, Erlangen (DE)

(72) Inventors: Ting Qiang Xue, Shenzhen (CN); Ping Chen, Shenzhen (CN)

(73) Assignee: Siemens Healthcare GmbH, Erlangen (DE)

( * ) Notice: Subject to any disclaimer, the term of this patent is extended or adjusted under 35 U.S.C. 154(b) by 203 days.

(21) Appl. No.: 16/778,079

(22) Filed: Jan. 31, 2020

(65) Prior Publication Data

US 2020/0249294 A1    Aug. 6, 2020

(30) Foreign Application Priority Data

Jan. 31, 2019    (CN) .......................... 201910097885.4

(51) Int. Cl.
*G01R 33/38* (2006.01)
*G01R 33/385* (2006.01)
*H05K 7/20* (2006.01)

(52) U.S. Cl.
CPC ..... *G01R 33/3804* (2013.01); *G01R 33/3852* (2013.01); *G01R 33/3856* (2013.01); *H05K 7/20327* (2013.01); *H05K 7/20336* (2013.01); *H05K 7/20354* (2013.01)

(58) Field of Classification Search
CPC ............ G01R 33/3856; G01R 33/3804; G01R 33/3403; G01R 33/3852; H05K 7/20327; H05K 7/20336; H05K 7/20354; Y02E 60/14; F25B 25/005; F28D 20/023
See application file for complete search history.

(56) References Cited

U.S. PATENT DOCUMENTS

| 7,489,132 | B2  |   | 2/2009  | Arik et al.   |           |
|-----------|-----|---|---------|---------------|-----------|
| 11,193,702| B2  | * | 12/2021 | Bissell ...... | F28D 20/021 |
| 2006/0032623 | A1 | * | 2/2006 | Tsubone ...... | F28D 20/00 |
|           |     |   |         |               | 165/202   |
| 2012/0048768 | A1 | * | 3/2012 | Holloway ..... | C09K 5/063 |
|           |     |   |         |               | 206/524.1 |
| 2015/0114007 | A1 |   | 4/2015 | Neilson et al. |          |
| 2016/0187013 | A1 | * | 6/2016 | Becker ....... | F24F 5/0017 |
|           |     |   |         |               | 62/99     |
| 2018/0283709 | A1 | * | 10/2018 | Al-Hallaj ... | F24F 5/001 |
| 2019/0210790 | A1 | * | 7/2019 | Rizzo ........ | B65D 81/18 |

FOREIGN PATENT DOCUMENTS

| CN | 104684360 | A  |   | 6/2015 |           |
|----|-----------|----|---|--------|-----------|
| CN | 205946479 | U  |   | 2/2017 |           |
| CN | 106642855 | A  |   | 5/2017 |           |
| CN | 108513498 | A  |   | 9/2018 |           |
| EP | 3321623   | B1 | * | 11/2019 | ........... F28D 20/021 |

* cited by examiner

*Primary Examiner* — Frantz F Jules
*Assistant Examiner* — Martha Tadesse
(74) *Attorney, Agent, or Firm* — Banner & Witcoff Ltd.

(57) ABSTRACT

A cooling system of a magnetic resonance apparatus is disclosed. In the cooling system, a first cooling device and a second cooling device are used to realize a secondary step of cooling of a circulating fluid without energy consumption, thereby reducing the operating energy consumption of the cooling system. In addition, a magnetic resonance apparatus comprising the cooling system is further provided.

20 Claims, 4 Drawing Sheets

COOLING SYSTEM OF A MAGNETIC RESONANCE APPARATUS AND MAGNETIC RESONANCE APPARATUS

CROSS-REFERENCE TO RELATED APPLICATIONS

The present application claims the benefit of the filing date of Chinese patent application no. 201910097885.4, filed on Jan. 31, 2019, the contents of which are incorporated herein by reference in their entirety.

TECHNICAL FIELD

The present disclosure relates to a cooling system of a magnetic resonance apparatus, and in particular to a more energy-saving cooling system and a magnetic resonance apparatus comprising the cooling system.

BACKGROUND

Magnetic resonance apparatuses have a variety of heat generating elements, such as a magnet cold head compressor and a gradient coil. During use, these heat generating elements need to be cooled to operate at a temperature with stable electrical performance. In view of the above situation, fixed-frequency or variable-frequency refrigeration systems are often used for cooling. However, the operating process of the magnetic resonance apparatus is often discontinuous. Thus, short-term operation requires large amounts of power, has high energy consumption, and generates a great deal of heat, whereas a non-operating state has low system energy consumption and generates little heat. Therefore, current cooling systems have shown to be inadequate in light of this discontinuous mode of operation.

SUMMARY

An objective of the present disclosure is to provide a cooling system of a magnetic resonance apparatus, which can effectively reduce the requirements for a desired cooling system and realize stable and rapid cooling.

Another objective of the present disclosure is to provide a magnetic resonance apparatus with a cooling system that can effectively reduce the operating energy consumption and realize stable and rapid cooling.

The present disclosure provides a cooling system of a magnetic resonance apparatus. The cooling system comprises a second cooling loop for heat exchange with a heat generating element of the magnetic resonance apparatus, and a first cooling loop for heat exchange with the second cooling loop. The cooling system comprises a first cooling device and a second cooling device. The first cooling device comprises a first cooling tank and a heat exchange pipe. The first cooling tank is filled with a first phase-change heat accumulator. The heat exchange pipe penetrates the first cooling tank and is in contact with the first phase-change heat accumulator. The heat exchange pipe is coupled with the second cooling loop. The second cooling device comprises a second cooling tank, a secondary circulating fluid pipe, and a primary circulating fluid pipe. The second cooling tank is filled with a second phase-change heat accumulator. The secondary circulating fluid pipe penetrates the second cooling tank, and is in contact with the second phase-change heat accumulator. The secondary circulating fluid pipe is coupled with the second cooling loop. The phase-change temperature of the second phase-change heat accumulator is lower than that of the first phase-change heat accumulator. The primary circulating fluid pipe penetrates the second cooling tank, and is in contact with the second phase-change heat accumulator. The primary circulating fluid pipe is coupled with the first cooling loop.

In the cooling system, the first cooling device and the second cooling device are used to realize a secondary step of cooling of a circulating fluid without energy consumption, thereby reducing the operating energy consumption of the cooling system and reducing the operating cost while ensuring stable and rapid cooling.

In another exemplary embodiment of the cooling system, the primary circulating fluid pipe and the secondary circulating fluid pipe perform contact heat conduction through a heat conducting member.

In still another exemplary embodiment of the cooling system, a portion of the heat exchange pipe that is located inside the first cooling tank extends circuitously, and/or a portion of the secondary circulating fluid pipe that is located inside the second cooling tank extends circuitously, and/or a portion of the primary circulating fluid pipe that is located inside the second cooling tank extends circuitously. In this way, the heat exchange pipe, the secondary circulating fluid pipe, and/or the primary circulating fluid pipe are in more sufficient contact with the phase-change heat accumulators to improve the refrigerating efficiency.

In a further exemplary embodiment of the cooling system, a plurality of fins are formed on a portion of the heat exchange pipe that is located inside the first cooling tank, and/or a plurality of fins are formed on a portion of the secondary circulating fluid pipe that is located inside the second cooling tank, and/or a plurality of fins are formed on a portion of the primary circulating fluid pipe that is located inside the second cooling tank. The heat exchange areas of the heat exchange pipe, the secondary circulating fluid pipe, and/or the primary circulating fluid pipe can be enlarged, and the refrigerating efficiency can be improved.

In a further exemplary embodiment of the cooling system, the cooling system further comprises a compression refrigeration device. The compression refrigeration device is in communication with the first cooling loop. The cooled fluid is generated in the primary circulating fluid pipe accordingly.

In a further exemplary embodiment of the cooling system, the first phase-change heat accumulator and the second phase-change heat accumulator are made of phase-change materials. The phase-change temperature of the first phase-change heat accumulator is 19° C. to 22° C. or 23° C. to 25° C. The phase-change temperature of the second phase-change heat accumulator is 6° C. to 9° C. or 10° C. to 12° C. The cooling of the magnetic resonance apparatus is thus facilitated during operation. Temperature fluctuations during the operation of the magnetic resonance apparatus can also be effectively alleviated.

In a further exemplary embodiment of the cooling system, the phase-change material of the first phase-change heat accumulator is paraffin, methyl palmitate, or stearate. The phase-change material of the second phase-change heat accumulator is a eutectic salt $Na_2SO_4$-$10H_2O$ containing $NH_4Cl$ and $KCl$, a mixture of aqueous capric acid and lauric acid, or paraffin oil, wherein the mass ratio of aqueous decanoic acid to lauric acid in the mixture of aqueous decanoic acid and lauric acid is 65:35, and the mixture contains 10% of methyl salicylic acid. The cost thereof is low.

In a still further exemplary embodiment of the cooling system, a filler is mixed in the phase-change material of the first phase-change heat accumulator or the second phase-change heat accumulator; and the filler includes alumina powder, graphite powder, and/or aluminum nitride powder.

The present disclosure further provides a magnetic resonance apparatus, comprising a heat generating element and the cooling system described above. The second cooling loop is capable of exchanging heat with the heat generating element. In the cooling system, the first cooling device and the second cooling device are used to realize a secondary step of cooling of a circulating fluid without energy consumption, thereby reducing the operating energy consumption of the cooling system, and reducing the operating cost while ensuring stable and rapid cooling.

In another exemplary embodiment of the magnetic resonance apparatus, the heat generating element is a magnet cold head compressor, a gradient coil, a gradient power amplifier, or a radio frequency power amplifier. In this way, the main components of the magnetic resonance apparatus can be cooled.

BRIEF DESCRIPTION OF THE DRAWINGS/FIGURES

The following accompanying drawings merely illustratively describe and explain the present disclosure and do not limit the scope of the present disclosure.

DESCRIPTION OF REFERENCE SIGNS

Figure 1:
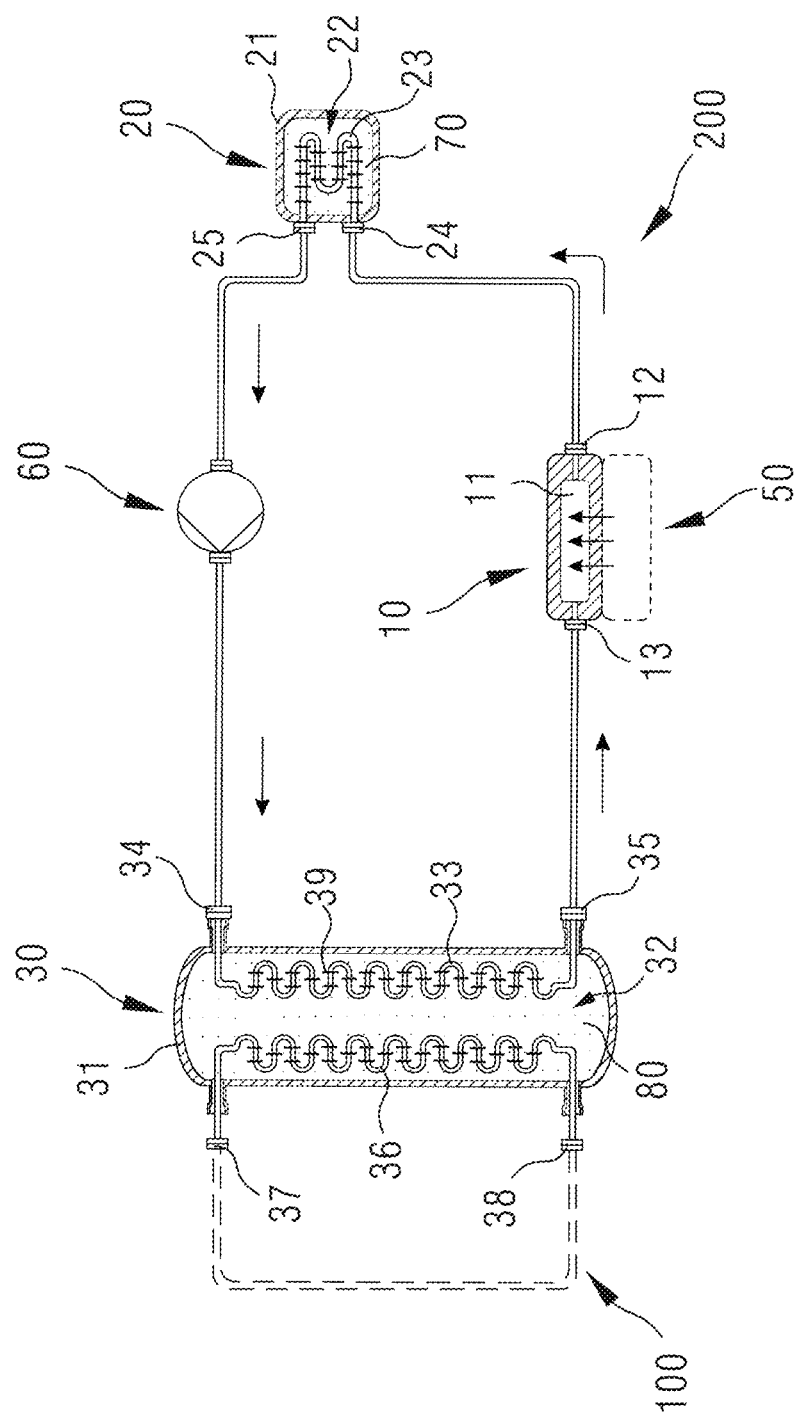
FIG. 1 is a schematic diagram of the composition of an exemplary embodiment of a cooling system of a magnetic resonance apparatus.

10 Heat sink
11 Fluid passage
12 Passage outlet
13 Passage inlet
20 First cooling device
21 First cooling tank
22 First heat exchange cavity
23 Heat exchange pipe
24 Pipeline inlet
25 Pipeline outlet
26, 39 Fin
30 Second cooling device
31 Second cooling tank
32 Second heat exchange cavity
33 Secondary circulating fluid pipe
34 Pipeline inlet of secondary circulating fluid pipe
35 Pipeline outlet of secondary circulating fluid pipe
36 Primary circulating fluid pipe
37 Refrigerant pipeline interface
38 Refrigerant pipeline interface
40 Compression refrigeration device
41, 42 Cooling circulation end
50 Heat generating element
60 Drive pump
70 First phase-change heat accumulator
80 Second phase-change heat accumulator
100 First cooling loop
200 Second cooling loop

DETAILED DESCRIPTION

For better understanding of the technical features, objectives, and effects of the present disclosure, the particular embodiments of the present disclosure are now described herein with reference to the accompanying drawings. In the figures, the same reference sign denotes components having the same or similar structure and the same function.

The term "exemplary" herein means "serving as an example, instance, or description", and any "exemplary" illustration and embodiment herein should not be interpreted as a more preferred or a more advantageous technical solution.

The terms "first", "second", etc. herein do not indicate their importance or order, etc., but are only used to indicate the differences between them for the convenience of description of the document.

FIG. 1 is a schematic diagram of the composition of an exemplary embodiment of a cooling system of a magnetic resonance apparatus. The magnetic resonance apparatus comprises a heat generating element 50. As shown in FIG. 1, the cooling system comprises a second cooling loop 200 for heat exchange with the heat generating element 50 of the magnetic resonance apparatus, and a first cooling loop 100 for heat exchange with the second cooling loop 200. The cooling system further comprises a first cooling device 20 and a second cooling device 30. A heat sink 10 for heat exchange with the heat generating element 50 of the magnetic resonance apparatus is provided in the second cooling loop 200. The heat sink 10 has a fluid passage 11. The fluid passage 11 has a passage inlet 13 and a passage outlet 12. The heat sink 10 is used for heat exchange with the heat generating element 50 and transfers heat to a fluid contained in the fluid passage 11.

The heat sink 10 is disposed near the heat generating element 50 to sufficiently exchange heat with the heat generating element 50. The heat sink 10 and the heat generating element 50 may also be designed as an integrated structure. For example, when the heat generating element 50 is a gradient coil, the heat sink 10 may be designed to surround a conducting wire of the gradient coil, such that the fluid passage 11 surrounds the periphery of the conducting wire to achieve a better cooling effect.

The first cooling device 20 comprises a first cooling tank 21 and a heat exchange pipe 23. The first cooling tank 21 is filled with a first phase-change heat accumulator 70. Specifically, the first cooling tank 21 is internally provided with a first heat exchange cavity 22. The first phase-change heat accumulator 70 is disposed in the first heat exchange cavity 22. The heat exchange pipe 23 penetrates the first cooling tank 21, and a portion of the heat exchange pipe 23 that is located in the first heat exchange cavity 22 is in contact with the first phase-change heat accumulator 70. A pipeline inlet 24 of the heat exchange pipe 23 is coupled with the passage outlet 12 of the fluid passage 11. In this way, the heat exchange pipe 23 is coupled with the second cooling loop 200.

The second cooling device 30 comprises a second cooling tank 31, a secondary circulating fluid pipe 33, and a primary circulating fluid pipe 36. The second cooling tank 31 is filled with a second phase-change heat accumulator 80. Specifically, the second cooling tank 31 is internally provided with a second heat exchange cavity 32. The second phase-change heat accumulator 80 is disposed in the second heat exchange cavity 32. The secondary circulating fluid pipe 33 penetrates the second cooling tank 31, and a portion of the secondary circulating fluid pipe 33 that is located in the second heat exchange cavity 32 is in contact with the second phase-change heat accumulator 80. A pipeline inlet 34 of the secondary circulating fluid pipe 33 is coupled with a pipeline outlet 25 of the heat exchange pipe 23, and a pipeline outlet 35 of the secondary circulating fluid pipe 33 is coupled with the passage inlet 13 of the fluid passage 11. The phase-change temperature of the second phase-change heat accumulator 80 is lower than that of the first phase-change heat accumulator 70.

The primary circulating fluid pipe 36 penetrates the second cooling tank 31, and a portion of the primary circulating fluid pipe 36 that is located in the second heat exchange cavity 32 is in contact with the second phase-change heat accumulator 80. The primary circulating fluid pipe 36 is coupled with the first cooling loop 100. However, this is by way of example and the embodiments herein are not limited to this configuration. In other exemplary embodiments, refrigerant pipeline interfaces 37, 38 are respectively provided at two ends of the primary circulating fluid pipe 36. The refrigerant pipeline interfaces 37, 38 are connected to a cold source.

The first phase-change heat accumulator 70 and the second phase-change heat accumulator 80 have high latent heat, and are made of, for example, phase-change materials. The heat diffused from the heat exchange pipe 23 enables the temperature of the first phase-change heat accumulator 70 to be increased through contact heat conduction to reach a phase-change temperature, and change the phase thereof. The heat diffused from the secondary circulating fluid pipe 33 enables the temperature of the second phase-change heat accumulator 80 to be increased through contact heat conduction to reach a phase-change temperature, and change the phase thereof. In this phase changing process, the first phase-change heat accumulator 70 and the second phase-change heat accumulator 80 are maintained at the phase-change temperatures while absorbing a large amount of heat. The primary circulating fluid pipe 36 absorbs the heat diffused by the second phase-change heat accumulator 80 and the secondary circulating fluid pipe 33 through contact heat conduction.

In this exemplary embodiment, the cooling system further comprises a drive pump 60 connected to the pipeline outlet 25 of the heat exchange pipe 23 and the pipeline inlet 34 of the secondary circulating fluid pipe 33 to realize circulating flow of the fluid in a pipeline. However, this is by way of example and the embodiments herein are not limited to this configuration. In other exemplary embodiments, another or alternative fluid drive device may be provided in the pipeline.

When the cooling system is in use, the heat sink 10 absorbs the heat generated by the heat generating element 50 and transfers the heat to the fluid contained in the fluid passage 11. The drive pump 60 drives the fluid to flow, such that the fluid that has absorbed the heat in the fluid passage 11 arrives at the heat exchange pipe 23 of the first cooling device 20. The heat exchange pipe 23 exchanges heat with the first phase-change heat accumulator 70, whereby the heat is transferred from the fluid in the heat exchange pipe 23 to the first phase-change heat accumulator 70 and the fluid is cooled. The fluid cooled in the heat exchange pipe 23 enters the secondary circulating fluid pipe 33 of the second cooling device 30 under the drive of the drive pump 60, and the secondary circulating fluid pipe 33 exchanges heat with the second phase-change heat accumulator 80, whereby the heat is transferred from the fluid in the secondary circulating fluid pipe 33 to the second phase-change heat accumulator 80 and the fluid is cooled. The fluid cooled in the second cooling device 30 returns to the fluid passage 11 to absorb heat again. Through such a cycle, the heat generating element 50 in the magnetic resonance apparatus is cooled. After the refrigerant pipeline interfaces 37, 38 of the second cooling device 30 are connected to the cold source, the second phase-change heat accumulator 80 and the second circulating fluid pipe 33 can be cooled indirectly or directly by the primary circulating fluid pipe 36 to improve the cooling capability of the second cooling device 30.

In the cooling system, the first cooling device 20 and the second cooling device 30 are used to realize a secondary step of cooling of the circulating fluid without energy consumption, thereby reducing the operating energy consumption of the cooling system, and reducing the operating cost while ensuring stable and rapid cooling.

In this exemplary embodiment, the first phase-change heat accumulator 70 and the second phase-change heat accumulator 80 are made of phase-change materials. In other exemplary embodiments, the phase-change materials are mixed with fillers, such as metals and composites thereof, alumina powder, graphite powder, and/or aluminum nitride powder, thereby improving the thermal conductivity. However, this is by way of example and the embodiments herein are not limited to this configuration. In other exemplary embodiments, the phase-change materials may be provided in such a way that they are adsorbed to thermally conductive porous ceramic, expanded graphite, or aluminum foam, which can also improve the thermal conductivity.

In this exemplary embodiment, the phase-change material of the first phase-change heat accumulator 70 is paraffin, methyl palmitate, or stearate. The phase-change material of the second phase-change heat accumulator 80 is a eutectic salt $Na_2SO_4$-$10H_2O$ containing $NH_4Cl$ and $KCl$, a mixture of aqueous capric acid and lauric acid, or paraffin oil. The mass ratio of aqueous decanoic acid to lauric acid in the mixture of aqueous decanoic acid and lauric acid is 65:35, and the mixture contains 10% of methyl salicylic acid. In this way, the cost can be reduced. The phase-change temperature of the first phase-change heat accumulator 70 is 19° C. to 22° C. or 23° C. to 25° C. The phase-change temperature of the second phase-change heat accumulator 80 is 6° C. to 9° C. or 10° C. to 12° C. The phase-change temperatures of the phase-change materials described above are within preferred temperature intervals during use and operation of the magnetic resonance apparatus. In the temperature intervals, more energy can be saved while the magnetic resonance apparatus is effectively cooled. Accordingly, heat can be accumulated through phase change at lower temperatures. However, this is by way of example and the embodiments herein are not limited to this configuration. In other exemplary embodiments, the types of the phase-change materials and the phase-change temperatures thereof can be adjusted as required.

In this exemplary embodiment, the cooling system is provided with only one heat sink 10, one first cooling device 20, and one second cooling device 30. However, it is not limited to this. In other exemplary embodiments, the numbers of the heat sink 10, the first cooling device 20, and the second cooling device 30 can also be adjusted as required, and they are arranged along a circulation pipeline.

As shown in FIG. 1, in this exemplary embodiment, a portion of the heat exchange pipe 23 that is located in the first heat exchange cavity 22 extends circuitously (e.g., follow a winding or meandering path). This structure increases the length of the heat exchange pipe 23 and enlarges the heat exchange contact area of the pipeline. When flowing through the heat exchange pipe 23, the fluid can sufficiently exchange heat with the first phase-change heat accumulator 70 through a wall of the heat exchange pipe 23. Similarly, portions of the secondary circulating fluid pipe 33 and the primary circulating fluid pipe 36 that are located in the second heat exchange cavity 32 also extend circuitously. In other exemplary embodiments, the heat exchange pipe 23, the secondary circulating fluid pipe 33, and the primary circulating fluid pipe 36 may be shaped as required (e.g. a linear shape).

Figure 2:
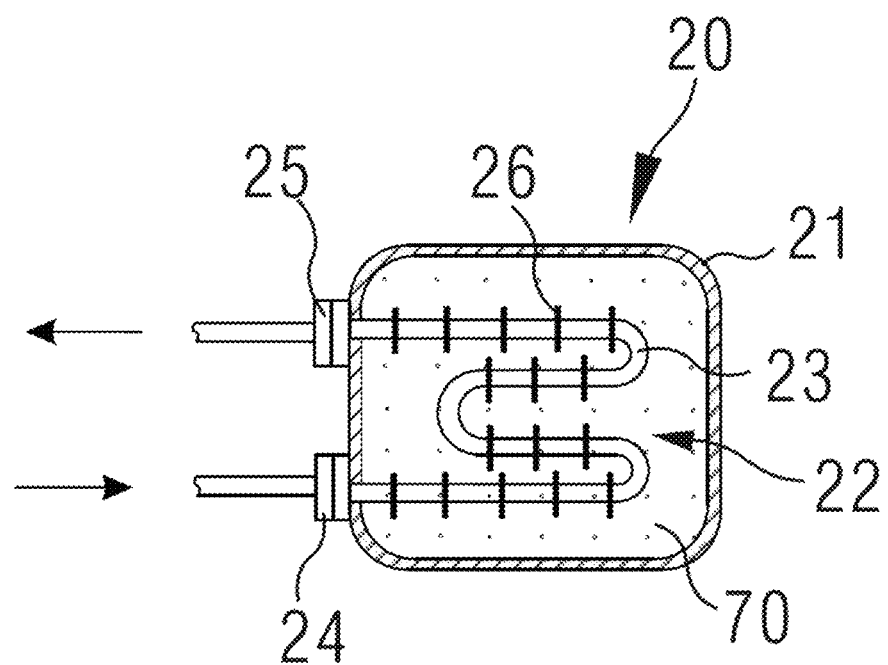
FIG. 2 is a partial cross-sectional view of a first cooling device shown in FIG. 1.

FIG. 2 is a partial cross-sectional view of the first cooling device 20 shown in FIG. 1. As shown in FIG. 2, in this exemplary embodiment, a plurality of fins 26 are formed on a portion of the heat exchange pipe 23 that is located inside the first cooling tank 21. Specifically, a plurality of fins 26 are formed on a surface of the heat exchange pipe 23 that faces the first heat exchange cavity 22. The fins 26 may be sequentially and uniformly arranged along the surface of the heat exchange pipe 23, for example. The heat is conducted from the fluid in the heat exchange pipe 23 to the first phase-change heat accumulator 70 through the fins 26. Through the fins 26, the contact area with the first phase-change heat accumulator 70 is enlarged, and the cooling rate and the heat exchange efficiency are improved.

Similarly, a plurality of fins 39 may be formed on the portions of the secondary circulating fluid pipe and/or the primary circulating fluid pipe 36 that are located inside the second cooling tank 31. Specifically, a plurality of fins 39 may also be formed on surfaces of the secondary circulating fluid pipe 33 and the primary circulating fluid pipe 36 that face the second heat exchange cavity 32 to enlarge the contact area with the second phase-change heat accumulator 80 and improve the cooling rate and the heat exchange efficiency.

Figure 3:
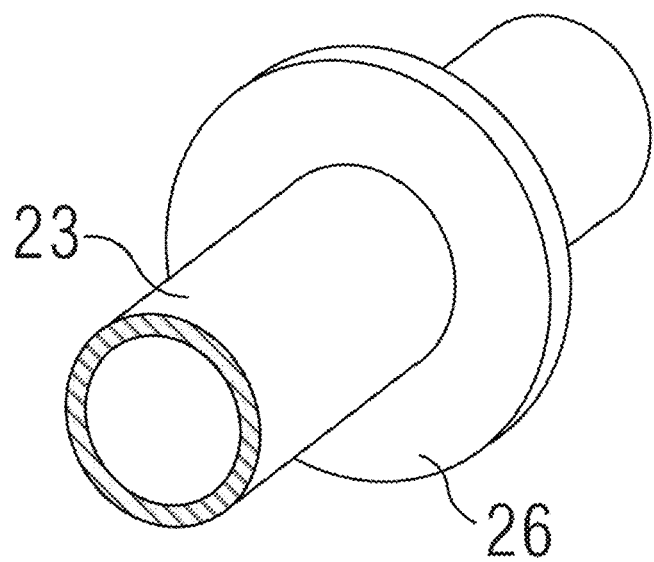
FIG. 3 illustrates the structure of a fin as shown in FIG. 2.

FIG. 3 illustrates the structure of a fin shown in FIG. 2. As shown in FIG. 3, each fin 26 surrounds the pipeline of the heat exchange pipe 23 to enlarge the heat exchange area.

In the exemplary embodiment, the primary circulating fluid pipe 36 and the secondary circulating fluid pipe 33 perform contact heat conduction through a heat conducting member. The heat conducting member may be a heat conducting plate. The primary circulating fluid pipe 36 and the secondary circulating fluid pipe 33 may be welded to the same heat conducting plate to conduct heat. It is also possible that the primary circulating fluid pipe 36 and the secondary circulating fluid pipe 33 penetrate the same heat conducting plate, and the heat exchange of the primary circulating fluid pipe 36 and the secondary circulating fluid pipe 33 is achieved by the heat conducting plate. However, this is by way of example and the embodiments herein are not limited to this configuration. In other exemplary embodiments, the heat conducting structure may be configured and adjusted as required. In this way, the efficiency of conducting heat from the secondary circulating fluid pipe 33 to the primary circulating fluid pipe 36 can be improved.

Figure 4:
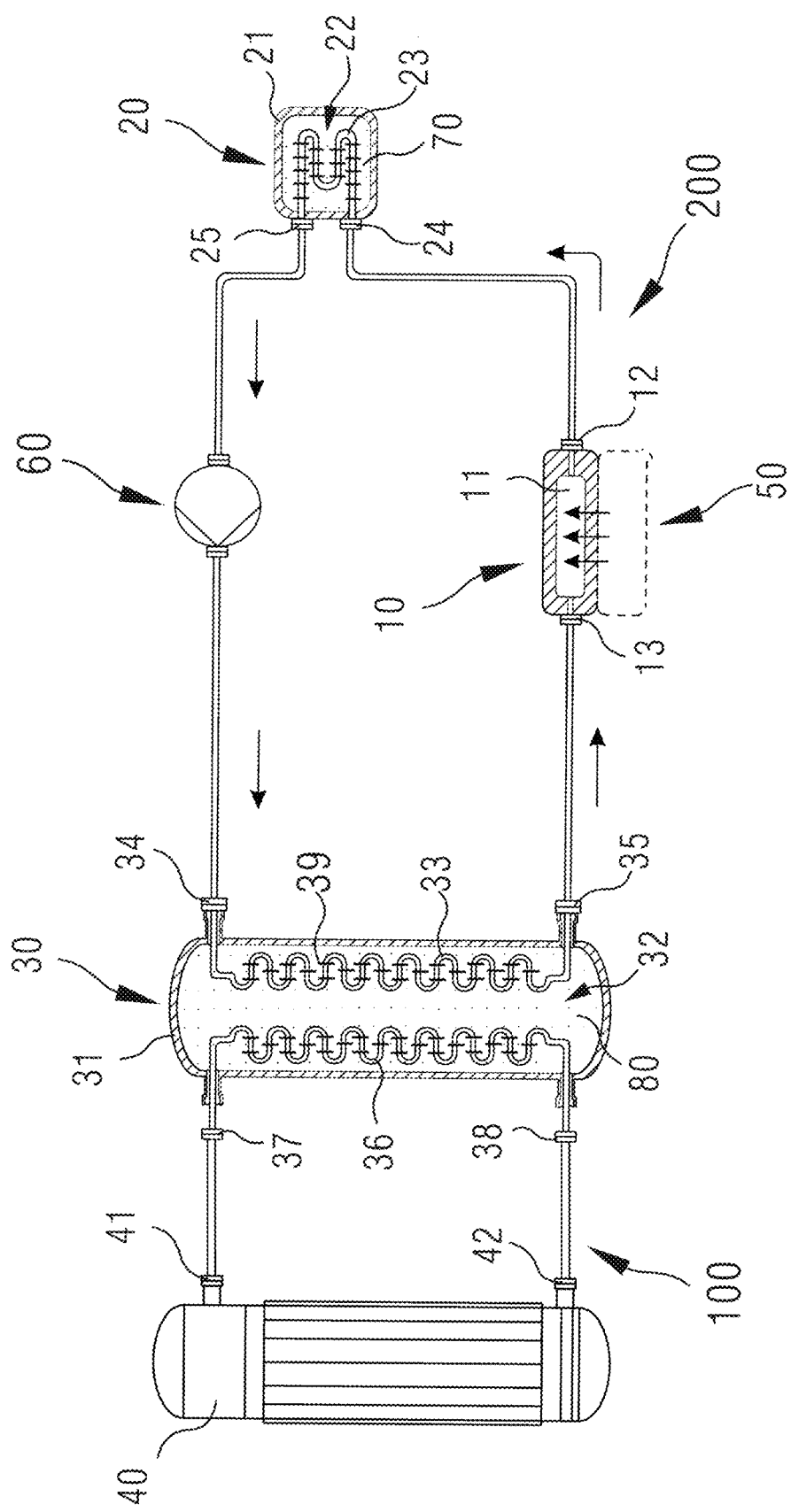
FIG. 4 is a schematic diagram of the composition of another exemplary embodiment of the cooling system of a magnetic resonance apparatus.

FIG. 4 is a schematic diagram of the composition of another exemplary embodiment of the cooling system of a magnetic resonance apparatus. The same or similar parts between the cooling system of this exemplary embodiment and the cooling system shown in FIG. 1 will not be described again herein. The difference is as follows: the cooling system further comprises a compression refrigeration device 40. A cooling circulation end 41 of the compression refrigeration device 40 is coupled with a refrigerant pipeline interface 37 of the second cooling device 30. The other cooling circulation end 42 is coupled with the other refrigerant pipeline interface 38 of the second cooling device 30. The compression refrigeration device 40 is used for refrigerating the fluid flowing through same, to generate the cooled fluid in the primary circulating fluid pipe 36.

During use, the compression refrigeration device 40 can be turned on or off as required. That is, when the first cooling device 20 and the second cooling device 30 can meet the refrigeration requirement, the compression refrigeration device 40 is turned off; and when the first cooling device 20 and the second cooling device 30 cannot meet the refrigeration requirement, the compression refrigeration device 40 supplements cold to meet the cooling requirement. As an example, when the magnetic resonance apparatus is in a "scanning" state in which the cooling requirement thereof exceeds the cooling capability of the first cooling device 20 and the second cooling device 30, a mode can be adopted in which the compression refrigeration device 40, the first cooling device 20, and the second cooling device 30 simultaneously operate. When the magnetic resonance apparatus is in a "stop" state (the scanning function is closed), a mode can be adopted in which only the first cooling device 20 and the second cooling device 30 operate. In this way, the flexibility of the cooling system is improved. The secondary cooling can also effectively avoid large fluctuations of the cooling fluid during cooling, so that the heat generating element can operate stably within a suitable temperature interval in various operating states of the magnetic resonance apparatus, and the imaging quality and the operating state of the magnetic resonance apparatus are more stable.

The present disclosure further provides a magnetic resonance apparatus. In an exemplary embodiment, the magnetic resonance apparatus comprises the cooling system and the heat generating element 50 shown in FIG. 1. The second cooling loop 200 can exchange heat with the heat generating element 50 through the heat sink 10 and transfer the heat to the fluid contained in the fluid passage 11. In the cooling system, the first cooling device 20 and the second cooling device 30 are used to realize a secondary step of cooling of the circulating fluid without energy consumption, thereby reducing the operating energy consumption of the cooling system, and reducing the operating cost while ensuring stable and rapid cooling.

In the exemplary embodiment, the heat sink 10 can perform contact heat conduction with the heat generating element 50. The contact heat conduction may be direct contact heat conduction or indirect contact heat conduction through a third party, but is not limited thereto. The heat generating element 50 is, for example, a magnet cold head compressor, a gradient coil, a gradient power amplifier, or a radio frequency power amplifier.

It should be understood that, although the description is given according to various embodiments, but each embodiment does not only include an independent technical solution, this narrative manner of the description is only for clarity, and for a person skilled in the art, the description shall be regarded as a whole, and the technical solutions in the various embodiments can also be properly combined to form other implementations that can be understood by a person skilled in the art.

The detailed descriptions set forth above are merely specific descriptions directed to the feasible embodiments of the present disclosure, and they are not intended to limit the scope of protection of the present disclosure; any equivalent embodiment or alteration of the present disclosure, such as the combination of features, the division or the duplication of a feature, made without departing from the technical spirit of the present disclosure, shall be included within the scope of protection of the present disclosure.

What is claimed is:

1. A cooling system of a magnetic resonance apparatus, the cooling system comprising: a first cooling loop configured for heat exchange with a second cooling loop, the second cooling loop configured for heat exchange with a heat generating element of the magnetic resonance apparatus; a compression refrigeration device coupled with the first cooling loop; a first cooling tank filled with a first phase-change heat accumulator, the first cooling tank being identified with a first cooling device; a heat exchange pipe penetrating the first cooling tank and in contact with the first phase-change heat accumulator, the heat exchange pipe coupled with the second cooling loop; a second cooling tank filled with a second phase-change heat accumulator, the second cooling tank being identified with a second cooling device; a primary circulating fluid pipe penetrating the second cooling tank and in contact with the second phase-change heat accumulator, the primary circulating fluid pipe coupled with the first cooling loop; and a secondary circulating fluid pipe penetrating the second cooling tank and in contact with the second phase-change heat accumulator, the secondary circulating fluid pipe coupled with the second cooling loop, wherein a phase-change temperature of the second phase-change heat accumulator is lower than that of the first phase-change heat accumulator such that the first phase-change heat accumulator and the second phase-change heat accumulator are maintained at different respective phase-change temperatures while absorbing heat via contact with the heat exchange pipe and the primary circulating fluid pipe, respectively, and wherein, when the magnetic resonance apparatus is in a scanning state identified with performing a scanning operation and a cooling requirement of the magnetic resonance apparatus exceeds a cooling capability of the first cooling device and the second cooling device, the cooling system is configured to operate in a first mode of operation during which the compression refrigeration device, the first cooling device, and the second cooling device simultaneously operate, and wherein, when the magnetic resonance apparatus is in a stop state identified with not performing the scanning operation, the cooling system is configured to operate in a second mode of operation during which the compression refrigeration device is turned off, and only the first cooling device and the second cooling device simultaneously operate.

2. The cooling system as claimed in claim 1, wherein the primary circulating fluid pipe and the secondary circulating fluid pipe perform heat conduction via a heat conducting plate.

3. The cooling system as claimed in claim 1, wherein a portion of the heat exchange pipe that is located inside the first cooling tank extends along a meandering path.

4. The cooling system as claimed in claim 1, wherein a portion of the secondary circulating fluid pipe that is located inside the second cooling tank extends along a meandering path.

5. The cooling system as claimed in claim 1, wherein a portion of the primary circulating fluid pipe that is located inside the second cooling tank extends along a meandering path.

6. The cooling system as claimed in claim 1, wherein a plurality of fins are formed on a portion of at least one of (i) the heat exchange pipe that is located inside the first cooling tank, (ii) a portion of the secondary circulating fluid pipe that is located inside the second cooling tank, or (iii) a portion of the primary circulating fluid pipe that is located inside the second cooling tank.

7. The cooling system as claimed in claim 1, wherein the first phase-change heat accumulator and the second phase-change heat accumulator contain phase-change materials.

8. The cooling system as claimed in claim 7, wherein the phase-change temperature of the phase-change material of the first phase-change heat accumulator is between 19° C. to 22° C.

9. The cooling system as claimed in claim 7, wherein the phase-change temperature of the phase-change material of the first phase-change heat accumulator is between 23° C. to 25° C.

10. The cooling system as claimed in claim 7, wherein the phase-change temperature of the phase-change material of the second phase-change heat accumulator is between 6° C. to 9° C.

11. The cooling system as claimed in claim 7, wherein the phase-change temperature of the phase-change material of the second phase-change heat accumulator is between 10° C. to 12° C.

12. The cooling system as claimed in claim 6, wherein the phase-change material of the first phase-change heat accumulator is at least one of paraffin, methyl palmitate, or stearate.

13. The cooling system as claimed in claim 12, wherein the phase-change material of the second phase-change heat accumulator is at least one of a eutectic salt $Na_2SO_4$-$10H_2O$ containing $NH_4Cl$ and $KCl$, a mixture of aqueous capric acid and lauric acid, or paraffin oil,
   wherein a mass ratio of aqueous decanoic acid to lauric acid in the mixture of aqueous decanoic acid and lauric acid is 65:35, and
   wherein the mixture of aqueous decanoic acid and lauric acid contains 10% of methyl salicylic acid.

14. The cooling system as claimed in claim 6, wherein a filler is mixed with the phase-change material of the first phase-change heat accumulator or the second phase-change heat accumulator, the filler including at least one of an alumina powder, a graphite powder, or an aluminum nitride powder.

15. The cooling system as claimed in claim 1, wherein the heat generating element of the magnetic resonance apparatus is at least one of a magnet cold head compressor, a gradient coil, a gradient power amplifier, or a radio frequency power amplifier.

16. The cooling system as claimed in claim 1, further comprising:
   a first plurality of fins arranged sequentially along the heat exchange pipe, each one of the first plurality of fins being ring-shaped and coupled to a single respective location of the heat exchange pipe within the first cooling tank and in contact with the first phase-change heat accumulator.

17. The cooling system as claimed in claim 16, further comprising:
   a second plurality of fins arranged sequentially along the primary circulating fluid pipe, each one of the second plurality of fins being ring-shaped and coupled to a single respective location of the primary circulating fluid pipe within the second cooling tank and in contact with the second phase-change heat accumulator.

18. The cooling system as claimed in claim 1, wherein during the second mode of operation a circulating fluid carried via the secondary circulating fluid pipe is cooled without energy consumption.

19. The cooling system as claimed in claim 18, wherein during the second mode of operation temperature fluctuations of the cooling fluid are prevented.

20. The cooling system of claim 18, wherein during the second mode of operation a temperature of the heat generating element is maintained within a temperature range during a plurality of operating states of the magnetic resonance apparatus, thereby improving imaging quality of images obtained via the magnetic resonance apparatus.

* * * * *